United States Patent
Choi et al.

(10) Patent No.: US 9,058,874 B2
(45) Date of Patent: Jun. 16, 2015

(54) SENSING CIRCUITS AND PHASE CHANGE MEMORY DEVICES INCLUDING THE SAME

(71) Applicant: Samsung Electronics Co., Ltd., Suwon-si, Gyeonggi-do (KR)

(72) Inventors: Young-Don Choi, Seoul (KR); Mu-Hui Park, Ansan-si (KR); Hyun-Kook Park, Seoul (KR); Ickhyun Song, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 143 days.

(21) Appl. No.: 13/781,997

(22) Filed: Mar. 1, 2013

(65) Prior Publication Data
US 2013/0308377 A1    Nov. 21, 2013

(30) Foreign Application Priority Data

May 18, 2012 (KR) ................. 10-2012-0053253

(51) Int. Cl.
*G11C 11/00* (2006.01)
*G11C 13/00* (2006.01)

(52) U.S. Cl.
CPC .......... *G11C 13/004* (2013.01); *G11C 13/0009* (2013.01); *G11C 13/0004* (2013.01); *G11C 13/0069* (2013.01); *G11C 2213/72* (2013.01)

(58) Field of Classification Search
CPC ............. G11C 13/004; G11C 13/0009; G11C 13/0004; G11C 2213/72; G11C 13/0069
USPC .............. 365/163, 148, 158, 189.15, 185.21, 365/185.23, 230.06
See application file for complete search history.

(56) References Cited

U.S. PATENT DOCUMENTS

| | | | |
|---|---|---|---|
| 4,486,739 A | 12/1984 | Franaszek et al. | |
| 6,839,275 B2 | 1/2005 | Van Brocklin et al. | |
| 7,606,111 B2 | 10/2009 | Lee et al. | |
| 7,957,207 B2 * | 6/2011 | Parkinson | 365/189.15 |
| 8,120,960 B2 * | 2/2012 | Varkony | 365/185.16 |
| 8,773,887 B1 * | 7/2014 | Naji | 365/148 |
| 2010/0132047 A1 | 5/2010 | Rodriguez et al. | |
| 2010/0232205 A1 * | 9/2010 | Parkinson | 365/148 |

FOREIGN PATENT DOCUMENTS

KR    10-2010-0008627 A    1/2010

* cited by examiner

*Primary Examiner* — Gene Auduong
(74) *Attorney, Agent, or Firm* — Lee & Morse, P.C.

(57) ABSTRACT

A sensing circuit includes a plurality of cell read current generators, a reference current generator and a plurality of sense amplifiers. Each of the cell read current generators generates a cell read current from each of a plurality of memory cells. The reference current generator sums the cell read currents to generate a sum current. Each of the sense amplifiers determines data state stored in each of the memory cells based on each of the cell read currents and an average current. The average current is obtained based on the sum current.

21 Claims, 8 Drawing Sheets

FIG. 2

| 3b Decimal | 3b Binary (HGF) | 4b Binary (fghi) | |
|---|---|---|---|
| | INPUT | RD=-1 | RD=+1 |
| 0 | 000 | 0100 | 1011 |
| 1 | 001 | 1001 | |
| 2 | 010 | 0101 | |
| 3 | 011 | 0011 | 1100 |
| 4 | 100 | 0010 | 1101 |
| 5 | 101 | 1010 | |
| 6 | 110 | 0110 | |
| 7 | 111 | 0001　1110 | 1000　0111 |

5b/6b CODE

| INPUT | | RD=−1 | RD=+1 | INPUT | | RD=−1 | RD=+1 |
|---|---|---|---|---|---|---|---|
| | EDCBA | abcdei | | | EDCBA | abcdei | |
| D.00 | 00000 | 100111 | 011000 | D.16 | 10000 | 011011 | 100100 |
| D.01 | 00001 | 011101 | 100010 | D.17 | 10001 | 100011 | |
| D.02 | 00010 | 101101 | 010010 | D.18 | 10010 | 010011 | |
| D.03 | 00011 | 110001 | | D.19 | 10011 | 110010 | |
| D.04 | 00100 | 110101 | 001010 | D.20 | 10100 | 001011 | |
| D.05 | 00101 | 101001 | | D.21 | 10101 | 101010 | |
| D.06 | 00110 | 011001 | | D.22 | 10110 | 011010 | |
| D.07 | 00111 | 111000 | 000111 | D.23 | 10111 | 111010 | 000101 |
| D.08 | 01000 | 111001 | 000110 | D.24 | 11000 | 110011 | 001100 |
| D.09 | 01001 | 100101 | | D.25 | 11001 | 100110 | |
| D.10 | 01010 | 010101 | | D.26 | 11010 | 010110 | |
| D.11 | 01011 | 110100 | | D.27 | 11011 | 110110 | 001001 |
| D.12 | 01100 | 001101 | | D.28 | 11100 | 001110 | |
| D.13 | 01101 | 101100 | | D.29 | 11101 | 101110 | 010001 |
| D.14 | 01110 | 011100 | | D.30 | 11110 | 011110 | 100001 |
| D.15 | 01111 | 010111 | 101000 | D.31 | 11111 | 101011 | 010100 |

# SENSING CIRCUITS AND PHASE CHANGE MEMORY DEVICES INCLUDING THE SAME

CROSS-REFERENCE TO RELATED APPLICATION

This application claims priority under 35 USC §119 to Korean Patent Application No. 10-2012-0053253, filed on May 18, 2012 in the Korean Intellectual Property Office and entitled: "Sensing Circuits and Phase Change Memory Devices Including the Same," which is incorporated by reference herein in its entirety.

BACKGROUND

1. Field

Example embodiments relate to semiconductor memory devices, and more particularly to sensing circuits and phase change memory devices including the same.

2. Description of the Related Art

Nonvolatile memory devices using resistance materials include a resistive random access memory (RRAM), a phase change random access memory (PRAM), and a magnetic random access memory (MRAM). Dynamic random access memory (DRAM) and flash memory devices store data using charges. Nonvolatile memory devices using resistance materials store data using the resistance of variable resistive elements (e.g., RRAM), phase change of phase change material such as chalcogenide alloy (e.g., PRAM), and resistance change of magnetic tunnel junction (MJT) thin films according to the magnetization state of a ferromagnetice substance.

Using phase change memory cells as an example, the phase change material changes into a crystalline state or an amorphous state by cooling after heating. Since the phase change material in the crystalline state has a low resistance and the phase change material in the amorphous state has a high resistance, the crystalline state may be defined as set data (0), and the amorphous state may be defined as reset data (1).

The phase change material has a resistance characteristic that drifts as time elapses after date is written in memory cells. Therefore, in the phase change memory devices, it is difficult for data to be read right after the date is written in memory cells. In addition, a sensing margin is greatly influenced by stored data pattern.

SUMMARY

According to some example embodiments, a sensing circuit includes a plurality of cell read current generators, each configured to generate a cell read current from each of a plurality of memory cells; a reference current generator configured to sum the cell read currents to generate a sum current; and a plurality of sense amplifiers, each configured to determine data state stored in each of the memory cells based on each of the cell read currents and an average current, the average current being obtained based on the sum current.

In an embodiment, each of the sense amplifiers may determine the data stored in each of the memory cells as reset state when the average current is greater than corresponding cell read current.

In an embodiment, each of the sense amplifiers may determine the data stored in each of the memory cells as set state when the average current is smaller than corresponding cell read current.

In an embodiment, the reference current generator may include a plurality of mirror transistors, each configured to mirror each of the cell read currents; and a summing transistor, connected to the plurality of mirror transistors, configured to sum the cell read currents.

The plurality of mirror transistors may be connected in parallel with respect to each other.

Each of the sense amplifiers may include a first mirror transistor configured to mirror each of the cell read currents; a second mirror transistor, connected to the first mirror transistor and connected to the summing transistor in a current mirror configuration, configured to generate the average current; and an inverter configured to output sensing data based on the each of the cell read currents and the average current.

The inverter may output the sensing data having the reset state when the average current is greater than corresponding cell read current.

The inverter may output the sensing data having the set state when the average current is smaller than corresponding cell read current.

According to some example embodiments, a phase change memory device includes a memory cell array including a plurality of memory cells; an input/output (I/O) circuit configured to store temporarily write data from an external device or provide read data from the memory cell array; an encoder configured to perform DC-balanced encoding on the write data to provide DC-balanced code data; a write driver configured to write the DC-balanced code data in the memory cell array; a sensing circuit configured to sense the DC-balanced code data stored in the memory cell array; and a decoder configured to perform DC-balanced decoding on the DC-balanced code data to provide the read data.

In an embodiment, the sensing circuit may include a plurality of cell read current generators, each configured to generate a cell read current from each of the memory cells; a reference current generator configured to sum the cell read currents to generate a sum current; and a plurality of the sense amplifiers, each configured to determine data state stored in each of the memory cells based on each of the cell read currents and an average current, the average current being obtained based on the sum current.

Each of the sense amplifiers may determine the data stored in each of the memory cells as reset state when the average current is greater than corresponding cell read current and each of the sense amplifiers may determine the data stored in each of the memory cells as set state when the average current is smaller than corresponding cell read current.

In an embodiment, the phase change memory device may further include an error correction encoder between the I/O circuit and the encoder.

In an embodiment, the phase change memory device may further include an error correction decoder between the decoder and the I/O circuit.

According to some example embodiments a sensing circuit includes a plurality of cell read current generators, each cell read current generator being configured to generate a cell read current from each of a plurality of memory cells, a real-time reference distribution generator configured to generate a reference distribution based on the cell read currents from each of a plurality of memory cells, and a plurality of sense amplifiers, each sense amplifier being configured to determine a data state stored in each of the memory cells based on reference distribution.

Each of the cell read currents may correspond to each bit of code data that are DC-balanced coded.

The real-time reference distribution generator may be configured to generate a reference distribution for each sensing operation.

The reference distribution may be centered on an average current of the cell read currents.

BRIEF DESCRIPTION OF THE DRAWINGS

Features will become apparent to those of ordinary skill in the art by describing in detail exemplary embodiments with reference to the attached drawings in which:

FIG. 2 illustrates a code table encoding upper 3-bits of 8-bit data into a 4-bit code.

FIG. 3 illustrates a code table encoding lower 5-bits of 8-bit data into a 6-bit code.

DETAILED DESCRIPTION OF THE EMBODIMENTS

Figure 1:
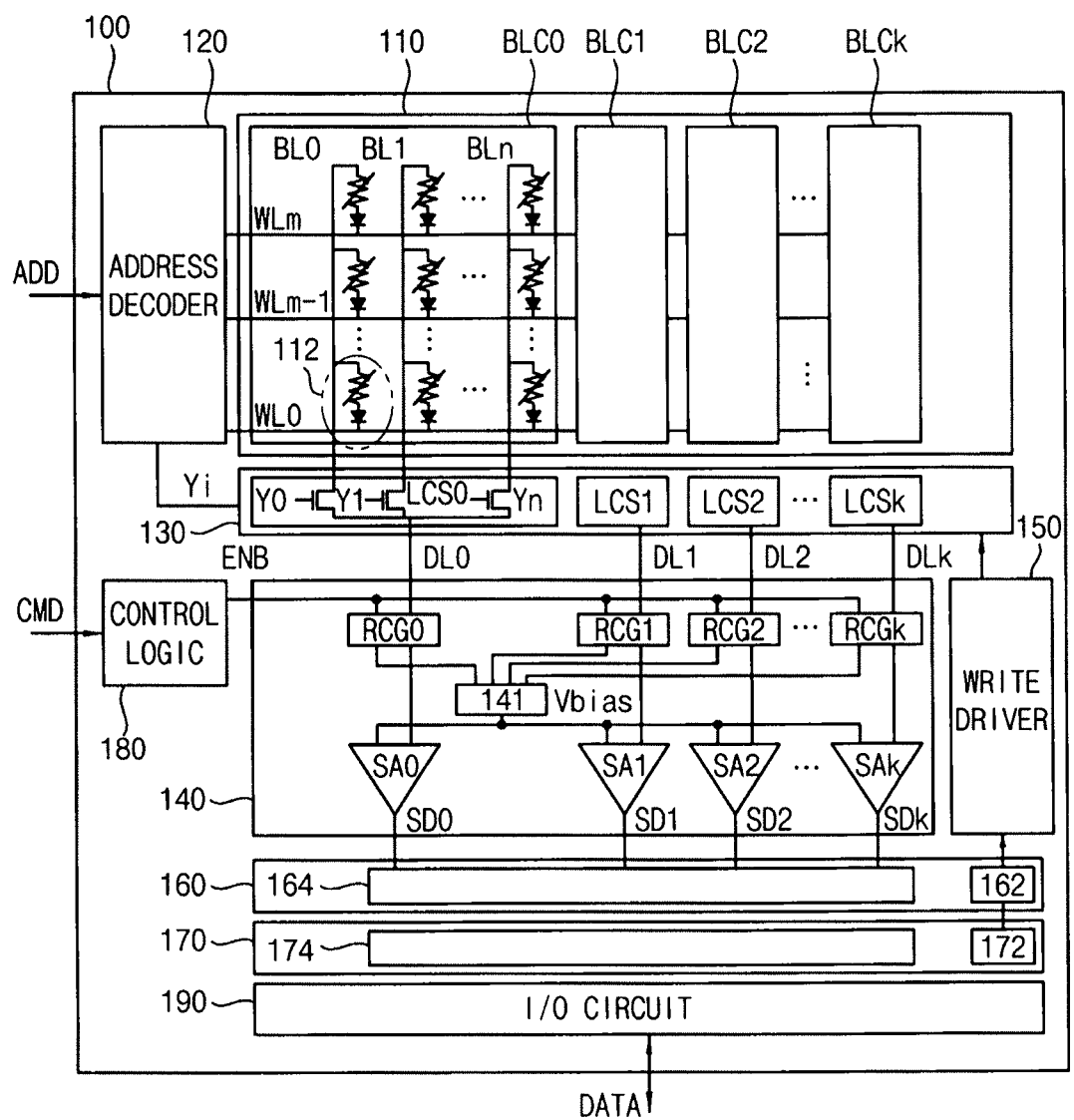
FIG. 1 illustrates a block diagram of a phase change memory device according to some example embodiments.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a phase change memory device according to some example embodiments. Referring to FIG. 1, a phase change memory device 100 includes a memory cell array 110, an address decoder 120, a bitline selector 130, a sensing circuit 140, a write driver 150, a DC balance codec 160, an error correction codec 170, an input/output circuit 190, and a control logic 180.

The memory cell array 110 includes a plurality of memory cell blocks BLC0~BLCk (k is a natural number greater than two). Each of the memory cell blocks BLC0~BLCk includes a plurality of memory cells 112. The memory cells 112 are connected to a plurality of wordlines WL0~WLm and a plurality of bitlines BL0~BLn respectively. Each of the memory cells 112 includes a variable resistive element that includes a phase change material having two different resistances according to a crystalline state and an amorphous state, and an access element that controls current flow in the variable resistive element. The access element may be a diode or a transistor connected to the variable resistive element in series.

The address decoder 120 decodes an address ADD to selects a wordline and a bitline. The address ADD includes a row address for selecting at least one of the wordlines WL0~WLm and a column address for selecting at least one of the bitlines BL0~BLn. In FIG. 1, wordline WL0 is selected of the wordlines WL0~WLm and bitline BL0 is selected of the bitlines BL0~BLn.

The bitline selector 130 includes a plurality of local column selectors LCS0~LCSk corresponding to the memory cell blocks BLC0~BLCk, and each of the local column selectors LCS0~LCSk selects a bitline in response to a selection signal Yi (i=0~n) from the address decoder 120. Each of the local column selectors LCS0~LCSk includes a plurality of selection transistors. For example, when a selection signal Y0 is enabled, the bitline BL0 is electrically connected to a data line DL0. The local column selector LCS1 is connected to a data line DL1, the local column selector LCS2 is connected to a data line DL2, and local column selector LCSk is connected to a data line DLk.

The sensing circuit 140 provides a read current Icell to the memory cell in sensing operation. The sensing circuit 140 includes a plurality of cell read current generators RCG0~RCGk, each corresponding to each of the memory cell blocks BLC0~BLCk, a reference current generator 141 and a plurality of sense amplifiers SA0~SAk, each corresponding to each of the memory cell blocks BLC0~BLCk. The cell read current generators RCG0~RCGk simultaneously provide corresponding memory cells with corresponding cell read currents Icell in response to read enable signal ENB. The cell read currents Icell are summed in the reference current generator 141 and an average current Iavg of the cell read currents Icell are obtained by following expression 1.

$$Iavg = \sum_{i=0}^{k} Icell\_i/(k+1) \qquad \text{[Expression 1]}$$

Each of the sense amplifiers SA0~SAk compares the average current Iavg and corresponding cell read current to provide corresponding sensing data SD0~SDk. Each of the sense amplifiers SA0~SAk determines a data state stored in a corresponding memory cell based on the comparison of the average current Iavg and the corresponding cell read current.

The sense amplifiers SA0~SAk provide the sensing data SD0~SDk to the DC-balance codec 160.

The write driver 150 writes DC-balanced code data in the memory cell array 110.

The DC-balance codec 160 includes an encoder 162 and a decoder 164. The encoder encodes 8-bit data into 10-bit data. The decoder 164 decodes 10-bit data into 8-bit data.

FIG. 2 illustrates a code table encoding upper 3-bit of 8-bit data into 4-bit code, and FIG. 3 is a code table encoding lower 5-bit of 8-bit data into 6-bit code.

In FIGS. 2 and 3, RD refers to the running disparity.

Referring to FIGS. 2 and 3, the encoder 162 divides 8-bit write data into upper 3-bit data and lower 5-bit data, encodes the upper 3-bit data and the lower 5-bit data into 4-bit code and 6-bit code respectively and provides 10-bit code data. The 10-bit code data includes same number of data '0' and data '1' or similar number of data '0' and data '1'. Therefore, ten memory cells in which write data are simultaneously written simultaneously have the same number of set states and reset states. For example, 8-bit write data "000 00000" is encoded into 10-bit code data "0100 100111" or "1011 011000". For example, 8-bit write data "111 11111" is encoded into 10-bit code data "1110 101011", "1000 101011", "1110 010100" or "0111 010100".

The encoded DC-balanced code data are written in the memory cell array 110 through the write driver 150.

The decoder 164 performs DC-balanced decoding inversely to the DC-balanced encoding.

The error correction codec 170 includes an error correction encoder 172 and an error correction decoder 174. The error correction encoder 172 adds an error correction code to the data received from the external device and provides the added data to the DC-balanced codec 160. The error correction decoder 174 detects errors in the read data referring to the error correction code of the read data and corrects errors in the read data.

The I/O circuit 190 temporarily stores write data from the external device or provide read data from the memory cell array 110 to the external device.

The control logic 180 generates control signals in response to a command CMD. The control logic 180 generates a read enable signal ENB for enabling the sensing circuit 140 when the control logic 180 receives read command.

The phase change memory device 100 may solve the problem due to the write data pattern by writing DC-balanced code data in the memory cell array 110. In addition, the phase change memory device 100 may solve the problem due to resistance by using the average value of the DC-balanced data as a reference current in a sensing operation, as described in detail below with reference to FIG. 4.

Figure 4:
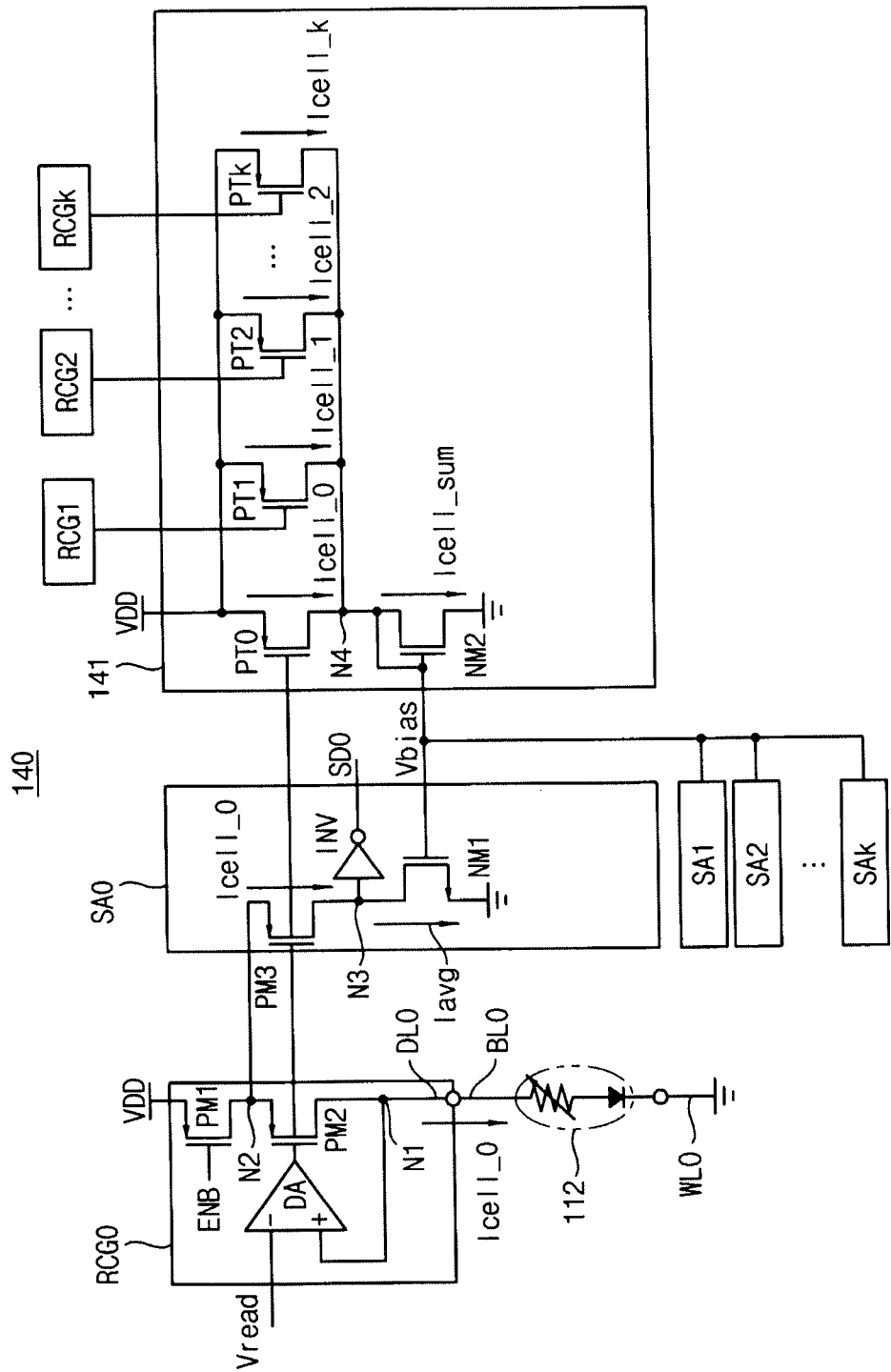
FIG. 4 illustrates a circuit diagram of an example of the sensing circuit in FIG. 1 according to some example embodiments.

FIG. 4 illustrates a circuit diagram of an example of the sensing circuit 140 in FIG. 1 according to some example embodiments. Referring to FIG. 4, the sensing circuit 140 includes a plurality of cell read current generators RCG0~RCGk, each corresponding to each of the memory cell blocks BLC0~BLCk, a reference current generator 141 and a plurality of sense amplifiers SA0~SAk, each corresponding to each of the memory cell blocks BLC0~BLCk.

The cell read current generator RCG0 includes a differential amplifier DA and a p-channel metal-oxide semiconductor (PMOS) transistors PM1 and PM2. A read voltage is applied to an inverting terminal of the differential amplifier DA. A non-inverting terminal of the differential amplifier DA is connected to a node N1 connected to the data line DL0. The PMOS transistor PM1 has a gate receiving the read enable signal ENB, a source connected to a power supply voltage VDD, and a drain connected to a node N2. The PMOS transistor PM2 has a gate connected to an output terminal of the differential amplifier DA, a source connected to the node N2, and a drain connected to the node N1.

In a sensing operation, when the read enable signal ENB is low-enabled, the PMOS transistor PM1 is turned-on, and thus, the node N2 is pulled-up. When the read voltage Vread is high-enabled, the output of the differential amplifier DA transitions to low level, and thus the PMOS transistor PM2 is turned-on. Since the PMOS transistors PM1 and PM2 are turned-on, cell read current Icell_0 is applied to the memory cell 112. The cell read current Icell_0 may be obtained by following expression 2

$$Icell\_0 = \frac{Vread - Vthd}{Rcell\_0 + Rb1\_0 + Rw1\_0} \qquad \text{[Expression 2]}$$

In the expression 2, Vthd denotes forward bias threshold voltage of the diode of the memory cell 112, Rcell_0 denotes resistance of the phase change material of the memory cell 112, Rb1_0 denotes resistance of the bitline BL0, and Rw1_0 denotes resistance of the wordline WL0.

Therefore, the cell read current Icell_0 increases when the resistance of the phase change material Rcell_0 is low in the set state (logic "0"), and the cell read current Icell_0 decreases when the resistance of the phase change material Rcell_0 is high in the reset state (logic "1").

Other cell read current generators RCG1~RCGk generate corresponding cell read currents Icell_1~Icell_k similarly as the cell read current generator RCG0.

The reference current generator 141 includes a plurality of PMOS transistors (or mirror transistors) PT0~PTk and an n-channel metal-oxide semiconductor (NMOS) transistor (or summing transistor) NM2. The PMOS transistor PT0 has a gate connected to a gate of the PMOS transistor PM2. The PMOS transistors PM2 and PT0 form a current mirror. When a size of the PMOS transistor PT0 is same as a size of the PMOS transistor PM2, drain current of the PMOS transistor PT0 is same as the cell read current Icell_0.

Since each of the remaining PMOS transistors PT1~PTk is current-mirrored connected to each of the cell read current generators RCG1~RCGk, each drain current of the PMOS transistors PT1~PTk is same as each of the cell read currents Icell_1~Icell_k. The cell read currents Icell_0~Icell_k are summed at a node N4 and a drain current Icell_sum of the NMOS transistor NM2 corresponds to sum of the cell read currents Icell_0~Icell_k.

The NMOS transistor NM2 has a source connected to a ground voltage and a drain connected to the node N4. The NMOS transistor NM2 is diode-connected, with a gate and the drain connected at the node N4. Therefore, a bias voltage Vbias at the node N4 corresponds to a threshold voltage Vth_NM2 of the NMOS transistor NM2.

The sense amplifier SA0 includes a PMOS transistor (a first mirror transistor) PM3, a NMOS transistor (a second mirror transistor) NM1, and an inverter INV.

The PMOS transistor PM3 has a source connected to the node N2, a drain connected to a node N3, and a gate which is mirrored-connected to a gate of the PMOS transistor PM2. When a size of the PMOS transistor PM3 is same as a size of the PMOS transistor PM2, a drain current of the PMOS transistor PM3 corresponds to Icell_0. The NMOS transistor NM1 has a source connected to the ground voltage, a drain connected to the node N3 and a gate which is mirrored-connected to the gate of the NMOS transistor NM2. When a size of the NMOS transistor NM2 is (k+1) times great as a size of the NMOS transistor NM1, a drain current of the NMOS transistor NM1 may be obtained by following expression 3

$$Iavg=Icell\_sum/k \quad \text{[Expression 3]}$$

The inverter INV reads voltage VN3 at the node N3 with respect to a threshold voltage Vth_INV of the inverter INV to output the sensing data SD0. When the average current Iavg is greater than a cell read current Icell_0, the inverter INV outputs the sensing data SD0 with the reset state (logic "0") because the voltage VN3 is greater than the voltage Vth_INV (VN3>Vth_INV). When the average current Iavg is smaller than to the cell read current Icell_0, the inverter INV outputs the sensing data SD0 with the set state (logic "1") because the voltage VN3 is smaller than the voltage Vth_INV (VN3≤Vth_INV).

Other sense amplifiers SA1~SAk output corresponding sensing data SD1~SDk similarly as the sense amplifier SA0.

Figure 5:
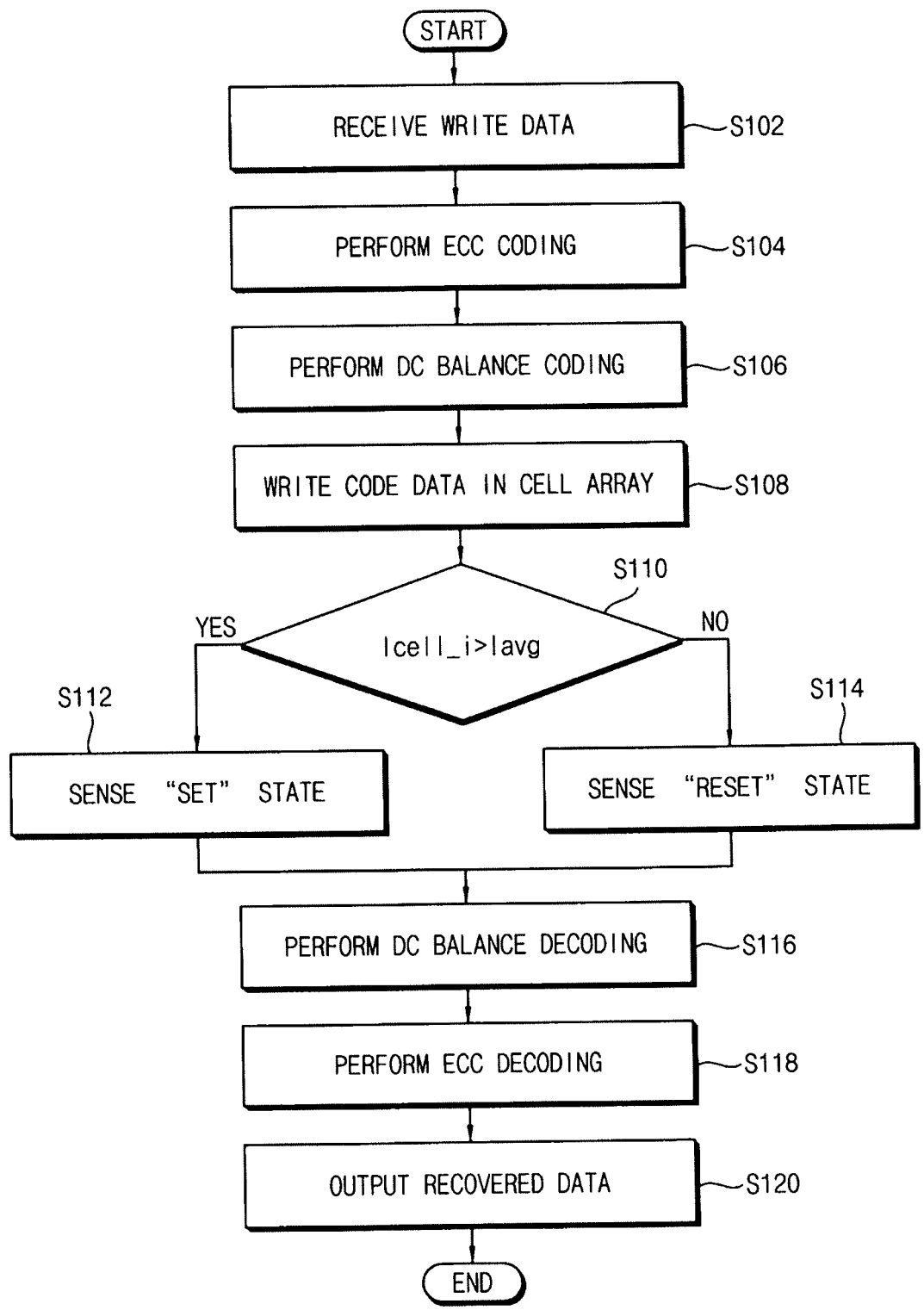
FIG. 5 illustrates a flow chart for describing operation of the phase change memory device of FIG. 1 according to some example embodiments.

FIG. 5 illustrates a flow chart for describing operation of the phase change memory device of FIG. 1 according to some example embodiments.

Referring to FIGS. 1 through 5, the phase change memory device 100 receives write address and write data in response to the read command (S102). The error correction encoder 172 adds an error correction code to the received data for error correction (S104). The DC-balance encoder 162 performs DC-balanced encoding on the error correction code-added data (S106). The write driver 105 writes the DC-balanced code data in the memory cell designated by the write address (S108). The sensing circuit 140 compares the cell read current Icell_i and the average current Iavg for verifying the write data (S110). When the cell read current Icell_i is greater than the average current Iavg, the write data is sensed as the set state (S112). When the cell read current Icell_i is less than the average current Iavg, the write data is sensed as the reset state (S114). The DC-balance decoder performs DC-balanced decoding on the sensed data (S116), and provides the DC-balanced decoded data to the error correction decoder 172. The error correction decoder 174 detects errors in the DC-balanced decoded data referring to the error correction code and corrects errors (S118). The JO circuit 190 receives the error-corrected data and outputs the recovered data as read data (S120).

In the normal write operation, the write data is DC-balanced encoded before being written in the memory cell array 110, and the read data from the memory cell array 110 is again is DC-balanced decoded.

According to one or more embodiments, since the phase change memory device 100 may generate the reference current using a simple logic circuit (for example, the reference current generator 140) rather than using reference cells, the phase change memory device 100 may have space flexibility and design ease.

Therefore, the phase change memory device 100 may sense read data while being robust to stored data patterns and the resistance drift because the phase change memory device 100 may maintain magnitude of read current in the wordline by performing DC-balanced encoding on the input data to obtain code data having substantially a same number of data '0' and data '1'.

Figure 6:
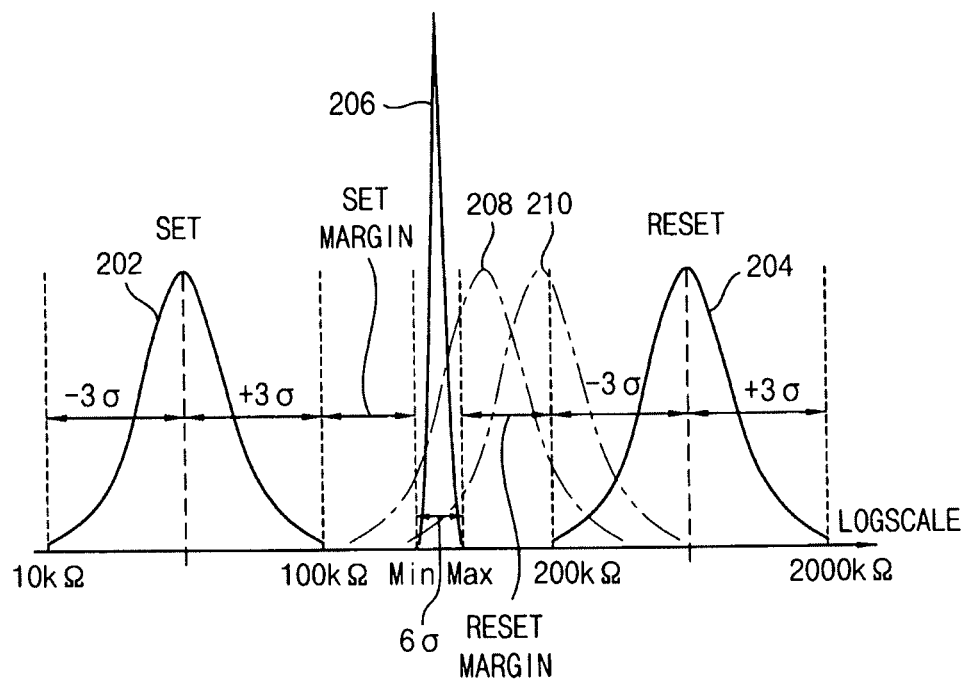
FIG. 6 illustrates a logarithmic scale graph of resistance distribution characteristic of set state and reset state of the conventional phase change memory device in a normal condition.

FIG. 6 illustrates a logarithmic scale graph of resistance distribution characteristic of a set state and a reset state of a conventional phase change memory device in a normal condition.

In FIG. 6, the normal condition refers to a stabilized state a certain time elapses after the data is written. In FIG. 6, a reference numeral 202 represents resistance distribution of the cell in the set state, a reference numeral 204 represents resistance distribution of the cell in the reset state, and a reference numeral 206 represents resistance distribution of a reference cell. In addition, a reference numeral 208 represents resistance distribution of the cell in 60% set state with respect to saturation resistance and a reference numeral 210 represents resistance distribution of the cell in 70% set state with respect to saturation resistance. The resistance of the cell in the set state moves towards the reference numerals 208, 210 and 204 as time elapses. When the sensing operation is performed using the conventional reference cell, the read operation needs to be delayed until the resistance distribution of the cell moves to the reference numeral 204. Therefore, the access to the phase change memory device is slow.

Figure 7:
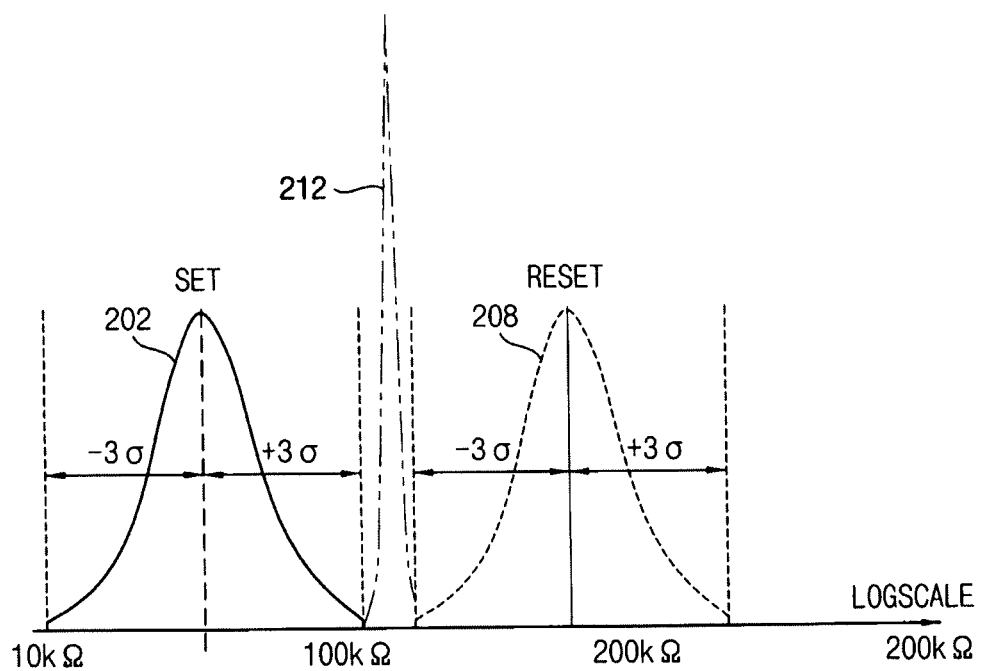
FIGS. 7 and 8 illustrate logarithmic scale graphs of resistance distribution characteristics of set state and reset state of the phase change memory device according to some example embodiments.
Figure 8:
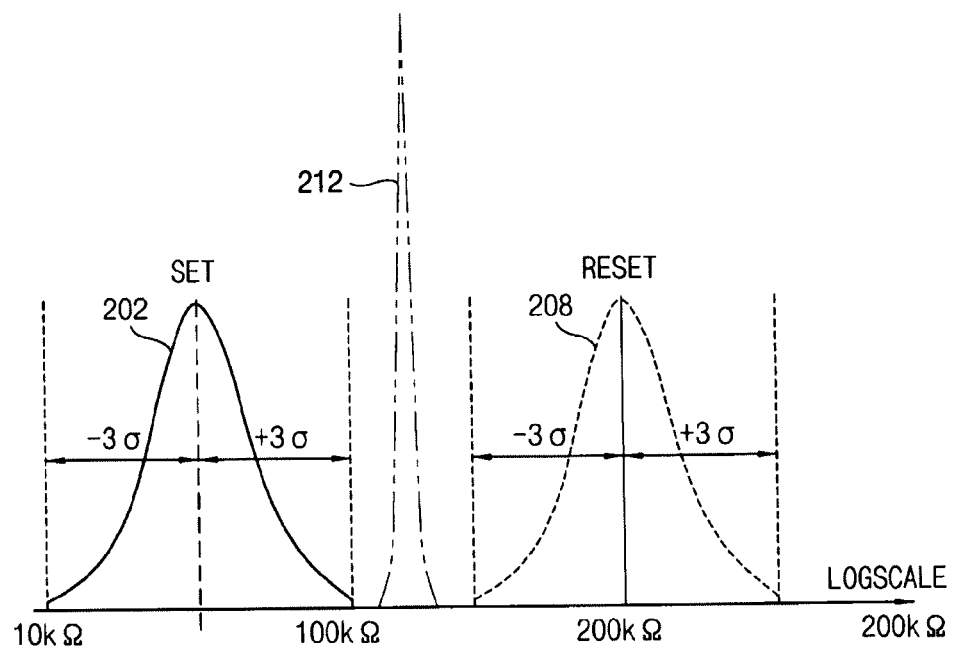

FIGS. 7 and 8 illustrate logarithmic scale graphs of resistance distribution characteristic of a set state and a reset state of the phase change memory device according to some example embodiments.

FIG. 7 illustrates resistance distribution of the cell in 60% set state with respect to saturation resistance and the FIG. 8 illustrates resistance distribution of the cell in 70% set state with respect to saturation resistance.

In FIGS. 7 and 8, a reference numeral 212 represents an equivalent reference resistance distribution curve.

Referring FIGS. 7 and 8, the average current drifts according to the resistance drift as time elapses because the equivalent reference resistance distribution curve 212 is calculated by the average current. In FIGS. 7 and 8, the equivalent reference resistance distribution curve 212 is placed at the center of the set state resistance distribution curve 202 and the reset state resistance distribution curve 208. That is, the equivalent reference resistance distribution curve 212 moves toward a direction in which the reset state resistance distribution curve 208 as time elapses. Therefore, by providing real-time determination, the equivalent reference resistance distribution curve 212 is automatically placed at the center of the set state resistance distribution curve 202 and the reset state resistance distribution curve 208 without regard to the resistance drift. Thus, a sensing margin may be guaranteed.

When the equivalent reference resistance distribution curve is automatically placed at the center of the set state resistance distribution curve and the reset state resistance distribution curve without regard to the resistance drift, read operation may be performed right after the data is written. Thus, high speed read operations are possible. In addition, high speed write-verify read operations are possible. In addition, since the average current of the read cell currents reflects process variation, voltage variation, and temperature variation, the reference current may be stabilized with respect to the process variation, the voltage variation, and the temperature variation.

Figure 9:
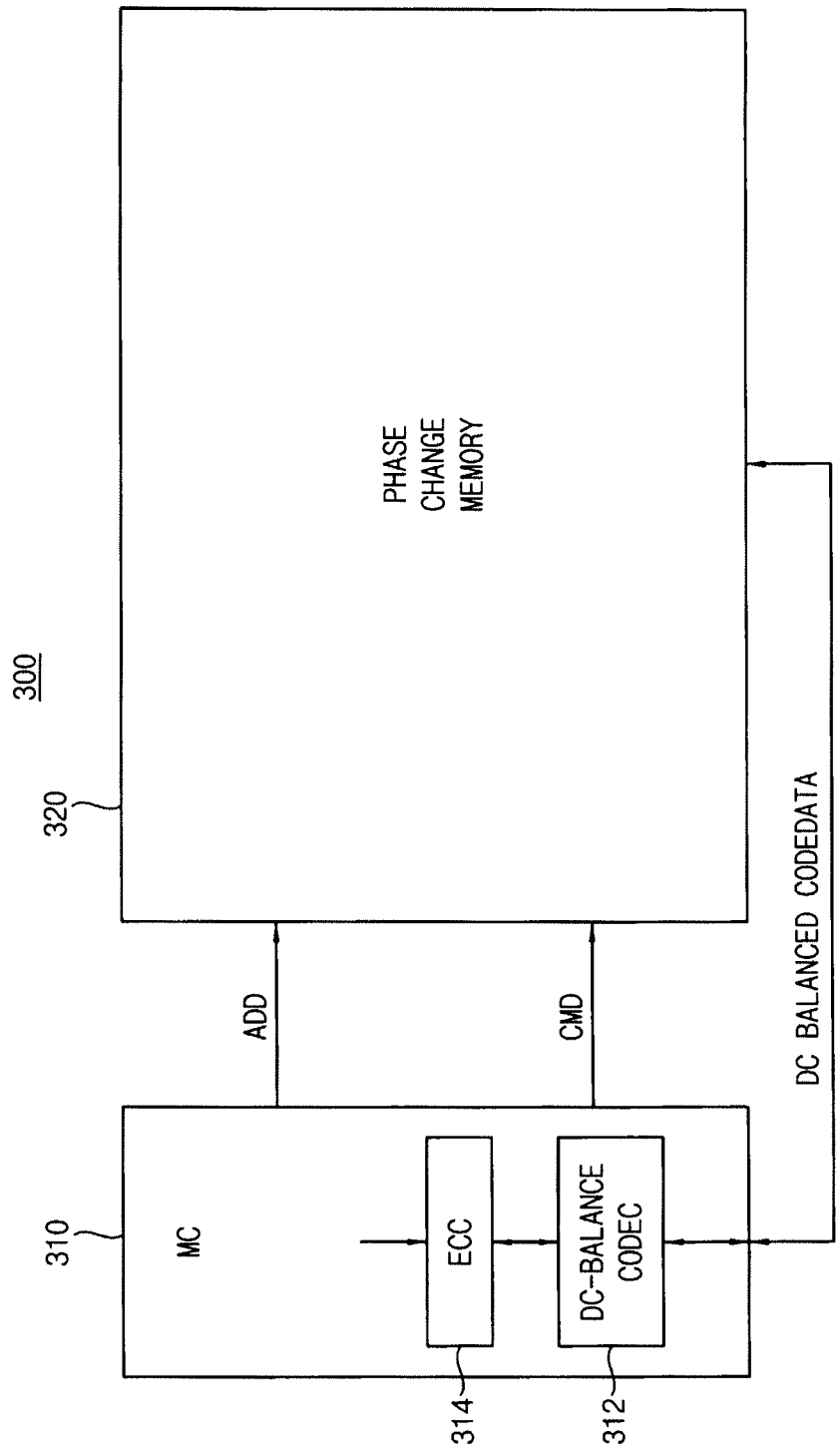
FIG. 9 illustrates a block diagram of a memory system according to some example embodiments.

FIG. 9 illustrates a block diagram of a memory system according to some example embodiments. Referring to FIG.

9, a memory system 300 includes a memory controller 310 and a phase change memory device 320.

The memory controller 310 includes an error correction codec 314 and a DC-balance codec 312. The DC-balance codec 312 encodes 8-bit write data into 10-bit DC-balanced code data. The error correction codec 314 performs error correction encoding on n-bit data, and the error correction-encoded n-bit data is encoded to (n+2)-bit DC-balanced code data. The DC-balanced code data is provided to the phase change memory device 320 according to the address ADD and the command CMD.

The phase change memory device 320 may be implemented with the phase change memory device 100 of FIG. 1 which does not include the DC balance codec 160 and the error correction codec 170. That is, the phase change memory device 320 may include a memory cell array 110, an address decoder 120, a bitline selector 130, a sensing circuit 140, a write driver 150, an input/output circuit 190, and a control logic 180. The phase change memory device 320 receives the DC-balanced code data directly from the memory controller 310, and writes the DC-balanced code data in the memory cell array and senses the cell read current based on the average current.

According to example embodiments, the write data is DC-balanced code data without regard to the DC-balance codec being implemented inside or outside of the phase change memory device, and the DC-balanced data may be sensed using the average current as the reference current. Accordingly, the phase change memory device may sense read data while being robust to stored data pattern and the resistance drift because the phase change memory device may maintain magnitude of read current in the wordline by performing DC-balanced encoding on the input data to obtain code data including substantially same number of data '0' and data '1'. Some example embodiments provide a sensing circuit capable of sensing data while being robust to resistance drift characteristic and stored data pattern. Further, by using real-time cell data, the sensing circuit may account for variations, including resistance drift, within the cells, thereby securing a good sensing margin and allowing fast operation.

In some embodiments, the phase change memory device 320, the memory controller 310 and/or the memory system 300 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The above described embodiments may be used in any device or system including a phase change memory device, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A sensing circuit, comprising:
  a plurality of cell read current generators, the plurality of cell read current generators to generate cell read currents from a plurality of memory cells for storing data;
  a reference current generator to sum at least two of the cell read currents to generate a sum current; and
  a plurality of sense amplifiers, each sense amplifier to determine a data state stored in a respective memory cell based on a corresponding cell read current from the respective memory cell and an average current, the average current being obtained based on the sum current.

2. The sensing circuit as claimed in claim 1, wherein each of the sense amplifiers is to determine the data state stored in the respective memory cell as a reset state when the average current is greater than the corresponding cell read current from the respective memory cell.

3. The sensing circuit as claimed in claim 1, wherein each of the sense amplifiers is to determine the data state stored in the respective memory cell as a set state when the average current is smaller than the corresponding cell read current from the respective memory cell.

4. The sensing circuit as claimed in claim 1, wherein the reference current generator comprises:
  a plurality of mirror transistors, the plurality of mirror transistors to mirror the cell read currents from the plurality of memory cells; and
  a summing transistor, connected to the plurality of mirror transistors, to sum the cell read currents.

5. The sensing circuit as claimed in claim 4, wherein the plurality of mirror transistors are connected in parallel to each other.

6. The sensing circuit as claimed in claim 4, wherein each of the sense amplifiers comprises:
  a first mirror transistor to mirror the corresponding cell read current from the respective memory cell;
  a second mirror transistor, connected to the first mirror transistor and connected to the summing transistor in a current mirror configuration, the second mirror transistor to generate the average current; and
  an inverter to output sensing data based on the corresponding cell read currents from the respective memory cell and the average current.

7. The sensing circuit as claimed in claim 6, wherein the inverter outputs sensing data having a reset state when the average current is greater than the corresponding cell read current from the respective memory cell.

8. The sensing circuit as claimed in claim 6, wherein the inverter outputs sensing data having a set state when the average current is smaller than the corresponding cell read current from the respective memory cell.

9. The sensing circuit as claimed in claim 4, wherein the summing transistor is diode-connected.

10. The sensing circuit as claimed in claim 1, wherein each of the cell read currents corresponds to each bit of code data that are DC-balanced coded.

11. A phase change memory device, comprising:
a memory cell array including a plurality of memory cells for storing data;
an input/output (I/O) circuit to temporarily store write data from an external device or provide read data from the memory cell array;
an encoder to perform DC-balanced encoding on the write data to convert the write data into DC-balanced code data;
a write driver to write the DC-balanced code data in the memory cell array;
a sensing circuit to sense the DC-balanced code data stored in the memory cell array; and
a decoder to perform DC-balanced decoding on the sensed DC-balanced code data to convert the sensed DC-balanced code data into the read data.

12. The phase change memory device as claimed in claim 11, wherein the sensing circuit comprises:
a plurality of cell read current generators, the plurality of cell read current generators to generate cell read currents from the plurality of memory cells;
a reference current generator to sum at least two of the cell read currents to generate a sum current; and
a plurality of the sense amplifiers, each sense amplifier to determine a data state stored in a respective memory cell based on a corresponding cell read current from the respective memory cell and an average current, the average current being obtained based on the sum current.

13. The phase change memory device as claimed in claim 12, wherein:
each of the sense amplifiers is to determine the data state stored in the respective memory cell as a reset state when the average current is greater than the corresponding cell read current from the respective memory cell; and
each of the sense amplifiers is to determine the data state stored in the respective memory cell as a set state when the average current is smaller than the corresponding cell read current from the respective memory cell.

14. The phase change memory device as claimed in claim 11, further comprising an error correction encoder between the I/O circuit and the encoder.

15. The phase change memory device as claimed in claim 11, further comprising an error correction decoder between the decoder and the I/O circuit.

16. The phase change memory device as claimed in claim 11, wherein the DC-balanced code data have equal numbers of data '0' and data '1'.

17. A sensing circuit, comprising:
a plurality of cell read current generators, the plurality of cell read current generators to generate cell read currents from a plurality of memory cells for storing data;
a real-time reference distribution generator to generate a reference distribution based on at least two of the cell read currents from the plurality of memory cells; and
a plurality of sense amplifiers, each sense amplifier to determine a data state stored in a respective memory cell based on a corresponding cell read current from the respective memory cell and the reference distribution.

18. The sensing circuit as claimed in claim 17, wherein each of the cell read currents corresponds to each bit of code data that are DC-balanced coded.

19. The sensing circuit as claimed in claim 17, wherein the real-time reference distribution generator is to generate the reference distribution for each sensing operation.

20. The sensing circuit as claimed in claim 17, wherein the reference distribution is centered on an average current of the cell read currents.

21. The sensing circuit as claimed in claim 20, wherein:
each of the sense amplifiers is to determine the data state stored in the respective memory cell as a reset state when the average current is greater than the corresponding cell read current from the respective memory cell; and
each of the sense amplifiers is to determine the data state stored in the respective memory cell as a set state when the average current is smaller than the corresponding cell read current from the respective memory cell.

* * * * *